United States Patent
Hu

(10) Patent No.: US 10,490,283 B2
(45) Date of Patent: Nov. 26, 2019

(12) United States Patent

(54) MEMORY MANAGEMENT METHOD, MEMORY CONTROL CIRCUIT UNIT AND MEMORY STORAGE DEVICE

(71) Applicant: PHISON ELECTRONICS CORP., Miaoli (TW)

(72) Inventor: Chun-Yang Hu, Taoyuan (TW)

(73) Assignee: PHISON ELECTRONICS CORP., Miaoli (JP)

( * ) Notice: Subject to any disclaimer, the term of this patent is extended or adjusted under 35 U.S.C. 154(b) by 0 days.

(21) Appl. No.: 15/831,319

(22) Filed: Dec. 4, 2017

(65) Prior Publication Data

US 2019/0103163 A1    Apr. 4, 2019

(30) Foreign Application Priority Data

Sep. 29, 2017   (TW) .............................. 106133799 A

(51) Int. Cl.
| | |
|---|---|
| G11C 16/10 | (2006.01) |
| G06F 12/02 | (2006.01) |
| G06F 3/06 | (2006.01) |
| G11C 16/14 | (2006.01) |

(52) U.S. Cl.
CPC .......... *G11C 16/105* (2013.01); *G06F 3/0614* (2013.01); *G06F 3/0652* (2013.01); *G06F 12/0246* (2013.01); *G11C 16/14* (2013.01); *G06F 2212/1036* (2013.01); *G06F 2212/2022* (2013.01); *G06F 2212/7201* (2013.01); *G06F 2212/7211* (2013.01)

(58) Field of Classification Search
CPC ..... G11C 16/105; G11C 16/14; G06F 3/0614; G06F 3/0652; G06F 12/0246; G06F 2212/1036; G06F 2212/2022; G06F 2212/7201; G06F 2212/7211
USPC .......................................................... 365/218
See application file for complete search history.

(56) References Cited

U.S. PATENT DOCUMENTS

| | | | | |
|---|---|---|---|---|
| 7,948,798 | B1 * | 5/2011 | Sheredy .............. | G11C 11/5628 365/185.11 |
| 9,082,512 | B1 * | 7/2015 | Davis .................. | G06F 11/1048 |
| 2008/0250195 | A1 * | 10/2008 | Chow .................. | G06F 12/0246 711/103 |
| 2009/0248952 | A1 * | 10/2009 | Radke ................. | G11C 11/5628 711/100 |
| 2009/0327591 | A1 * | 12/2009 | Moshayedi ......... | G06F 11/1441 711/103 |
| 2010/0064111 | A1 * | 3/2010 | Kunimatsu ............. | G06F 12/08 711/161 |
| 2010/0115192 | A1 * | 5/2010 | Lee ...................... | G06F 12/0246 711/103 |
| 2011/0302359 | A1 * | 12/2011 | Schmidberger ..... | G06F 12/0246 711/103 |

(Continued)

*Primary Examiner* — Sung Il Cho
(74) *Attorney, Agent, or Firm* — JCIPRNET

(57) ABSTRACT

A memory management method, a memory control circuit unit and a memory storage device are provided. The method includes: performing a single-layer erasing operation on one of physical erasing units; performing a multi-layer erasing operation on another one of the physical erasing units; and performing a wear leveling operation based on the one and the another one of the physical erasing units, wherein the another one of the physical erasing units is performed the wear leveling operation first than the one of the physical erasing units.

20 Claims, 8 Drawing Sheets

(56) References Cited

U.S. PATENT DOCUMENTS

| | | | | |
|---|---|---|---|---|
| 2013/0138870 A1* | 5/2013 | Yoon | ............... | G11C 11/5621 |
| | | | | 711/103 |
| 2013/0138915 A1* | 5/2013 | Sasaki | ............... | G06F 12/0246 |
| | | | | 711/170 |
| 2013/0173844 A1* | 7/2013 | Chen | ............... | G06F 12/0246 |
| | | | | 711/103 |
| 2013/0346676 A1* | 12/2013 | Kim | ............... | G06F 12/0246 |
| | | | | 711/103 |
| 2015/0179268 A1* | 6/2015 | Kim | ............... | G11C 13/004 |
| | | | | 365/185.03 |
| 2016/0077749 A1* | 3/2016 | Ravimohan | ............... | G06F 3/0617 |
| | | | | 711/103 |
| 2016/0170647 A1* | 6/2016 | Lin | ............... | G06F 12/0246 |
| | | | | 711/103 |
| 2016/0321010 A1* | 11/2016 | Hashimoto | ............... | G06F 12/0246 |
| 2018/0121128 A1* | 5/2018 | Doyle | ............... | G06F 3/0644 |

\* cited by examiner

| physical erasing unit | 410(0) | 410(1) | 410(2) | 410(3) | 410(4) | 410(5) | ... | 410(97) | 410(98) | 410(99) | 410(100) | ... |
|---|---|---|---|---|---|---|---|---|---|---|---|---|
| Single layer erasing count | 460 | 30 | 50 | 150 | 150 | 10 | ... | 330 | 250 | 70 | 50 | ... |
| Multi-layer erasing count | 50 | 400 | 250 | 290 | 10 | 140 | ... | 110 | 210 | 350 | 450 | ... |
| Erasing count | 510 | 430 | 300 | 440 | 150 | 150 | ... | 440 | 460 | 420 | 500 | ... |

FIG. 8

| physical erasing unit | 410(0) | 410(1) | 410(2) | 410(3) | 410(4) | 410(5) | ... | 410(97) | 410(98) | 410(99) | 410(100) | ... |
|---|---|---|---|---|---|---|---|---|---|---|---|---|
| Single layer erasing count | 460 | 30 | 50 | 150 | 140 | 10 | ... | 330 | 250 | 70 | 50 | ... |
| Multi-layer erasing count | 50 | 400 | 250 | 290 | 10 | 140 | ... | 110 | 210 | 350 | 450 | ... |
| Erasing count | 960 | 4030 | 2550 | 3050 | 240 | 1410 | ... | 1430 | 2350 | 3570 | 4550 | ... |

FIG. 9

MEMORY MANAGEMENT METHOD, MEMORY CONTROL CIRCUIT UNIT AND MEMORY STORAGE DEVICE

CROSS-REFERENCE TO RELATED APPLICATION

This application claims the priority benefit of Taiwan application serial no. 106133799, filed on Sep. 29, 2017. The entirety of the above-mentioned patent application is hereby incorporated by reference herein and made a part of this specification.

BACKGROUND

Technical Field

The present invention is related to a memory management method, and particularly to a memory management method for a rewritable non-volatile memory module, a memory control circuit unit and a memory storage device.

Description of Related Art

Digital cameras, mobile phones and MP3 players have been developed rapidly for the past few years, and consumers' needs for storage media have grown significantly as well. Since a rewritable non-volatile memory module (e.g., a flash memory) is characterized in data non-volatility, power saving, minimized size and non-mechanical structure, it is highly suitable to be embedded in various portable media devices listed above.

Generally speaking, in order to enhance the lifespan of rewritable non-volatile memory, physical erasing units in the rewritable non-volatile memory are used as uniformly as possible. For example, the physical erasing unit of rewritable non-volatile memory is divided into a data area and a free area. Conventional wear leveling method is performed as follows: after being executed for a period of fixed time or at a specific time point, the rewritable non-volatile memory switches the physical erasing unit in the data area and the physical erasing unit in the free area so that the physical erasing unit that has less erasing counts in the data area can be switched to the free area to be programmed (or written).

When the physical erasing unit with less erasing counts in the data area is switched to the free area, generally the physical erasing unit with more erasing counts in the free area is switched to the data area. However, a plurality of programming method may be applied on the physical erasing units (for example, a single layer memory cell (SLC) programming mode, a trinary level cell (TCL) programming mode are used to write into the memory storage device of data. Therefore, the physical erasing unit with higher number of erasing counts is not necessarily worn out the most. For example, the wearing that is generated for performing one time of TLC programming on the physical erasing unit is larger than the wearing that is generated for performing one time of SLC programming on the physical erasing unit. Therefore, it is an objective for persons skilled in the art to find out how to effectively measure the wearing degree of physical erasing unit in order to perform wear leveling operation.

SUMMARY

The present invention provides a memory management method, a memory control circuit unit and a memory storage device, which are capable of effectively performing wear leveling operation and prolonging the lifespan of a memory storage device.

An exemplary embodiment provides a memory management method for a rewritable non-volatile memory module, wherein the rewritable non-volatile memory module includes a plurality of physical erasing units. The method includes performing a single layer erasing operation on one of the physical erasing units for n times; performing a multi-layer erasing operation on another one of the physical erasing units for n times; and performing a wear leveling operation based on the one and the another one of the physical erasing units, wherein the another one of the physical erasing units is performed the wear leveling operation first than the one of the physical erasing units.

An exemplary embodiment provides a memory management method for a rewritable non-volatile memory module, wherein the rewritable non-volatile memory module has a plurality of physical erasing units. The memory management method includes recording a wear value for each of the physical erasing units. The memory management method further includes performing an erasing operation on a first physical erasing unit; when the first physical erasing unit stores a single bit, a first parameter is used to update the wear value corresponding to the first physical erasing unit, and when the first physical erasing unit stores a plurality of bits, a second parameter is used to update a wear value corresponding to the first physical erasing unit.

An exemplary embodiment provides a memory control circuit unit for controlling a rewritable non-volatile memory module, wherein the rewritable non-volatile memory module has a plurality of physical erasing units. The memory control circuit unit includes a host interface, a memory interface and a memory management circuit. The host interface is coupled to a host system. The memory interface is coupled to the rewritable non-volatile memory module. The memory management circuit is coupled to the host interface and the memory interface. The memory management circuit performs a single layer erasing operation on one of the physical erasing units for n times, and performing a multi-layer erasing operation on another one of physical erasing units for n times, and performing a wear leveling erasing operation based on the one and the another one of the physical erasing units, wherein the another one of the physical erasing units is performed the wear leveling operation first than the one of the physical erasing units.

An exemplary embodiment provides a memory storage device, including a connecting interface unit, a rewritable non-volatile memory module and a memory control circuit unit. The connecting interface unit is coupled to a host system. The rewritable non-volatile memory module includes a plurality of physical erasing units. The memory control circuit unit is coupled to the connecting interface unit and the rewritable non-volatile memory module. The memory control circuit unit performs a single layer erasing operation on one of the physical erasing units for n times, performing a multi-layer erasing operation on another one of the physical erasing units for n times, and performing a wear leveling operation based on the one and the another one of the physical erasing units, wherein the another one of the physical units is performed the wear leveling operation first than the one of the physical erasing units.

In summary, according to the exemplary embodiments, the memory management method, the memory control circuit unit and the memory storage device are capable of calculating the wear value of the physical erasing unit according to the wear caused by different programming modes to memory cell, and performing wear leveling operation according to the estimated wear value. In this manner, each of the physical erasing unit can be used more uniformly and the lifespan of memory storage device can be effectively improved.

In order to make the aforementioned features and advantages of the disclosure more comprehensible, embodiments accompanying figures are described in detail below.

BRIEF DESCRIPTION OF THE DRAWINGS

FIG. 8 is a schematic view of an erasing count table according to an exemplary embodiment.

FIG. 9 is a schematic view of a wear value table according to an exemplary embodiment.

DESCRIPTION OF EMBODIMENTS

Generally speaking, a memory storage device (also referred to as a memory storage system) includes a rewritable non-volatile memory module and a controller (also referred to as a control circuit unit). Generally, the memory storage device is used along with the host system so that the host system can write the data into the memory storage device or read data from the memory storage devices.

Figure 1:
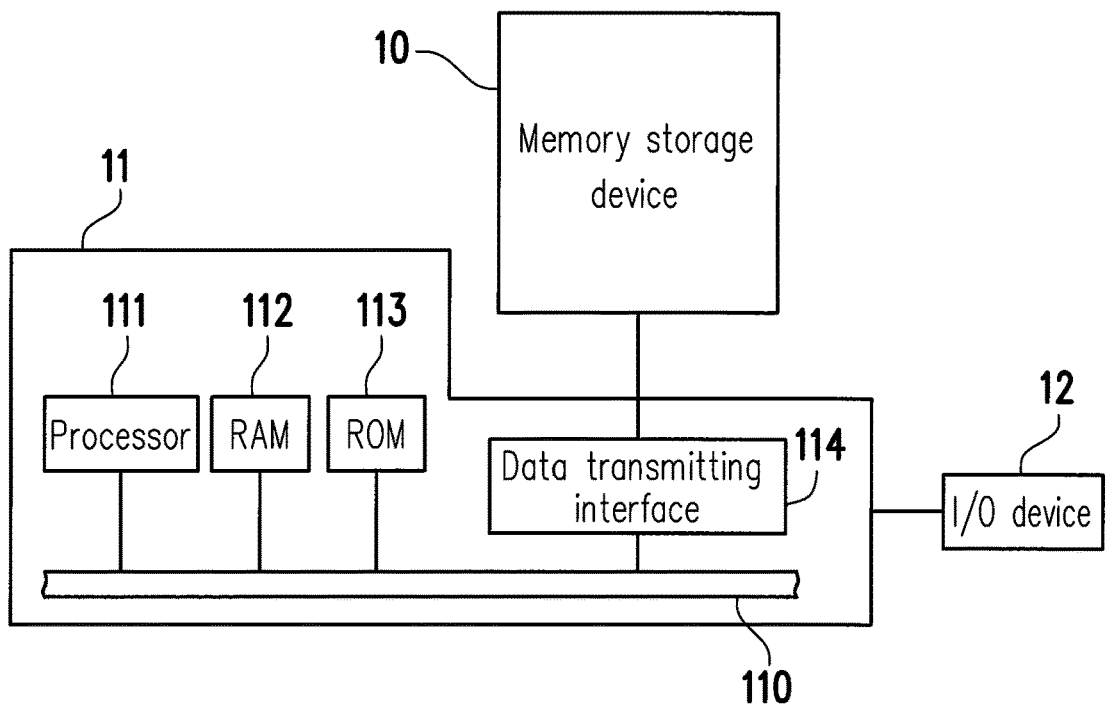
FIG. 1 is a schematic view of a host system, a memory storage device and an I/O device according to an exemplary embodiment.
Figure 2:
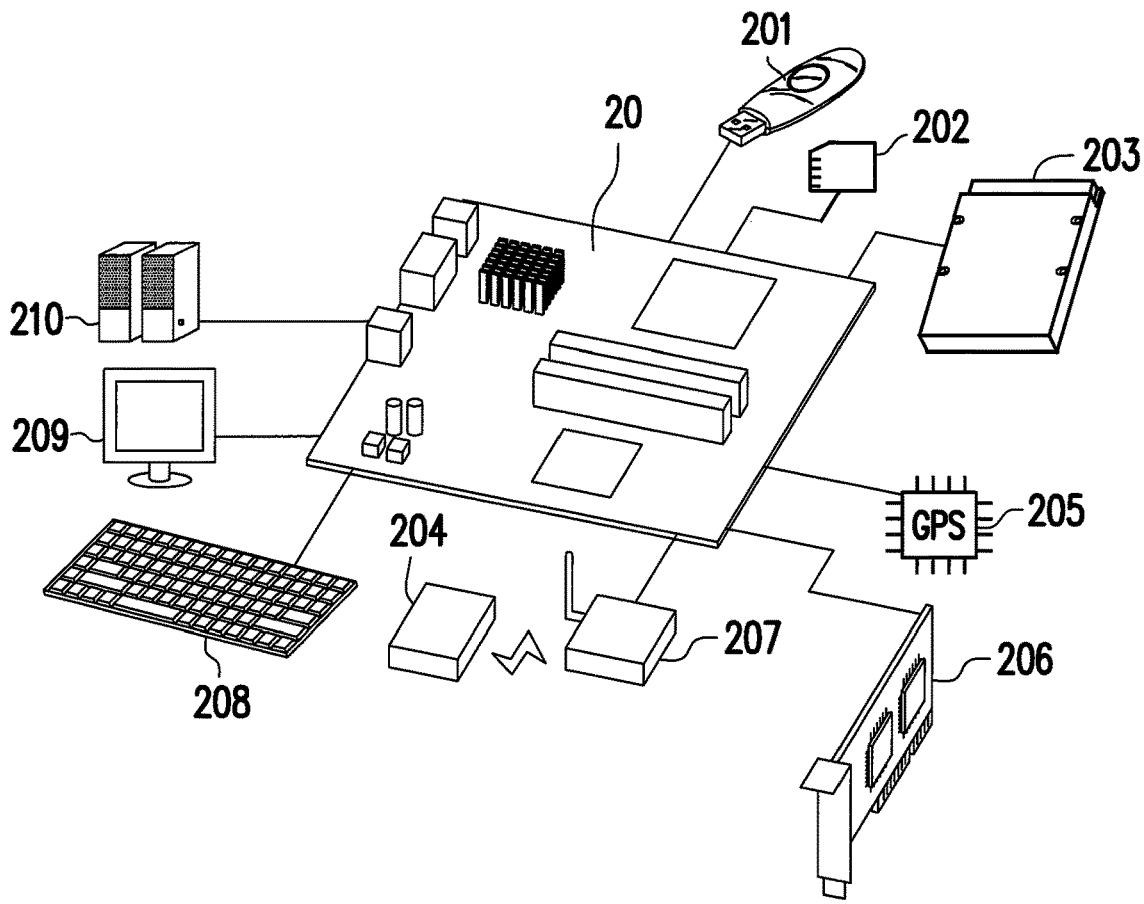
FIG. 2 is a schematic view of a host system, a memory storage device and an I/O device according to another exemplary embodiment.

FIG. 1 is a schematic view of a host system, a memory storage device and an I/O device according to an exemplary embodiment, and FIG. 2 is a schematic view of a host system, a memory storage device and an I/O device according to another exemplary embodiment.

Referring to FIG. 1 and FIG. 2, a host system 11 includes a processor 111, a random access memory (RAM) 112, a read only memory (ROM) 113 and a data transmitting interface 114. The processor 111, the RAM 112, the ROM 113 and the data transmitting interface 114 are coupled to a system bus 110.

In an exemplary embodiment, the host system 11 is coupled to the memory storage device 10 via the data transmitting interface 114. For example, the host system 11 may write the data into the memory storage device 10 or read the data from the memory storage device 10 via the data transmitting interface 114. In addition, the host system 11 is coupled to an I/O device 12 via the system bus 110. For example, the host system 11 may transmit an output signal to the I/O device 12 or receive an input signal from the I/O device 12 via the system bus 110.

In the exemplary embodiment, the processor 111, the RAM 112, the ROM 113 and the data transmitting interface 114 may be disposed on a motherboard 20 of the host system 11. The number of the data transmitting interface 114 may be one or more. With the data transmitting interface 114, the motherboard 20 may be coupled to the memory storage device 10 via a wired or a wireless manner. The memory storage device 10 may be, for example, a flash drive 201, a memory card 202, a solid state drive (SSD) 203 or a wireless memory storage device 204. The wireless memory storage device 204 may be various memory storage devices that use wireless communication technology as basis such as a near field communication storage (NFC) memory storage device, a WiFi memory storage device, a Bluetooth memory storage device or a Bluetooth low energy memory storage device (i.e., iBeacon). In addition, the motherboard 20 may be coupled to various I/O devices such as a global positioning system (GPS) module 205, a network interface card 206, a wireless transmitting device 207, a keyboard 208, a screen 209, a speaker 210 and so on via the system bus 110. For example, in an exemplary embodiment, the motherboard 20 can access the wireless memory storage device 204 via the wireless transmitting device 207.

Figure 3:
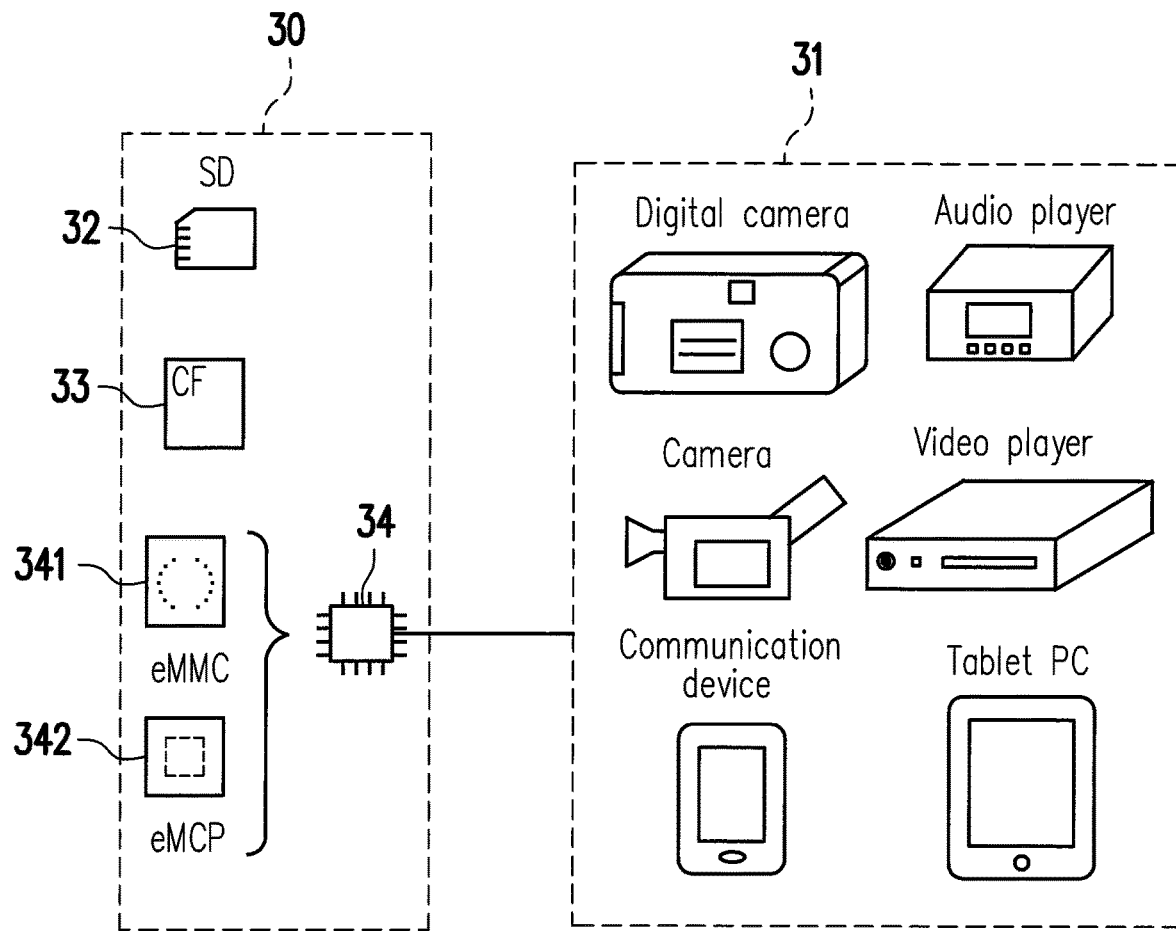
FIG. 3 is a schematic view of a host system and a memory storage device according to another exemplary embodiment.

In an exemplary embodiment, the host system may be any system that can substantially cooperate with the memory storage device to store data. In the above-mentioned exemplary embodiment, although the host system is described as a computer system, FIG. 3 is a schematic view of a host system and a memory storage device according to another exemplary embodiment. Referring to FIG. 3, in another exemplary embodiment, the host system 31 may be a system such as a digital camera, a camera, a communication device, an audio player, a video player or a tablet PC and so on. The memory storage device 30 may be various rewritable non-volatile memory storage devices such as an SD card 32, a CF card 33 or an embedded storage device 34 used therefor. The embedded storage device 34 is a variety of embedded storage devices including an embedded MMC (eMMC) card 341 and/or an embedded multi chip package (eMCP) storage device 342 that directly couple the memory module to the substrate of the host system.

Figure 4:
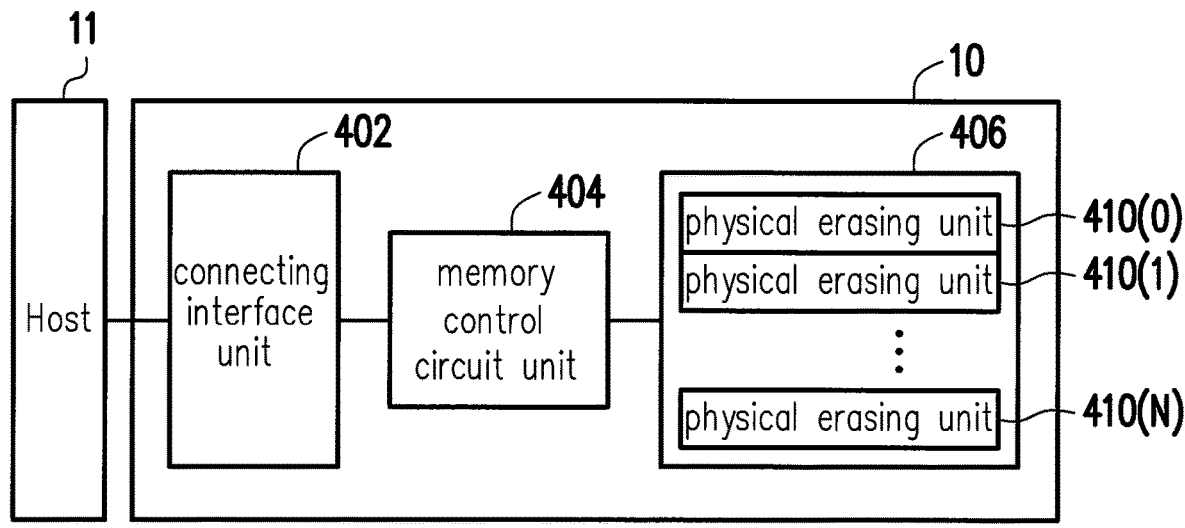
FIG. 4 is a, schematic block view of a host system and a memory storage device according to an exemplary embodiment.

FIG. 4 is a schematic block view of a host system and a memory storage device according to an exemplary embodiment.

Referring to FIG. 4, the memory storage device 10 includes a connecting interface unit 402, a memory control circuit unit 404 and a rewritable non-volatile memory module 406.

In the exemplary embodiment, the connecting interface unit 402 is compatible with a Serial Advanced Technology Attachment (SATA) standard; however, it should be indicated that the invention provides no limitation thereto. The connecting interface unit 402 may also be a standard that meets the Parallel Advanced Technology Attachment (PATA) standard, the Institute of Electrical and Electronic Engineers (IEEE) 1394 standard, the Peripheral Component Interconnect Express (PCI Express) standard, the Universal Serial Bus (USB) standard, the Ultra High Speed-I (UHS-I) interface standard, the Ultra High Speed-II (UHS-II) interface standard, the Secure Digital (SD) interface standard, the Memory Stick (MS) interface standard, the Multi-Chip Package interface standard, the Multi-Media Card (MMC) interface standard, the Embedded Multimedia Card (eMMC) interface standard, the Universal Flash Storage (UFS) interface standard, the embedded Multi Chip Package (eMCP) interface standard, the Compact Flash (CF) interface standard, the Integrated Device Electronics (IDE) standard or other suitable standards. In the exemplary embodiment, the connecting interface unit 402 may be packed in one chip along with the memory control circuit unit 404, or the connecting interface unit 402 is arranged outside a chip that contains the memory control circuit unit.

The memory control circuit unit 404 performs a plurality of logic gates or control commands implemented in the form of hardware of firmware, and writes, reads and erases data in the rewritable non-volatile memory module 406 according to the command of the host system 11.

The rewritable non-volatile memory module 406 is coupled to the memory control circuit unit 404 for storing the data written by the host system 11. The rewritable non-volatile memory module 406 has physical erasing units 410(0)~410(N). For example, the physical erasing units 410(0)~410(N) may belong to the same memory die or different memory dice. Each of the physical erasing units respectively have a plurality of physical programming units, wherein the physical programming units that belong to the same physical erasing unit may be independently written and erased simultaneously; however, it should be indicated that the invention provides no limitation thereto. Each of the physical erasing units may be constituted by 64 physical programming units, 256 physical programming units or any number of physical programming units.

More specifically, the physical erasing unit is the minimum unit for erasing operation. That is, each of the physical erasing units has the least number of memory cell that is erased altogether. The physical programming unit is the minimum unit for programming operation. In other words, the physical programming unit is the minimum unit for writing data. Generally, each of the physical programming unit includes a data bit area and a redundancy bit area. The data bit area includes a plurality of physical access addresses for storing user's data, and the redundancy bit area is used for storing data of system (e.g., control information and error correcting code). In the exemplary embodiment, the data bit area of each of the physical programming units includes 8 physical access addresses, and the size of each of the physical access addresses is 512 byte. However, in other exemplary embodiment, the data bit area may include a more number or a less number of physical access addresses; the invention provides no limitation to the size and the number of the physical access address. For example, in an exemplary embodiment, the physical erasing unit is a physical block, and the physical programming unit is a physical page or a physical sector, which should not be construed as a limitation to the invention.

In the exemplary embodiment, the rewritable non-volatile memory module 406 is a trinary level cell (TCL) NAND flash memory module (i.e., a flash memory cell module that can store 3 data bits in one memory cell). Specifically, the storage status of each memory cell of the rewritable non-volatile memory module 406 may be identified as "111", "110", "101", "100", "011", "010", "001" or "000", wherein the first bit counted from the left side is LSB, the second bit counted from the left side is CSB and the third bit counted from the left side is MSB. In addition, a plurality of memory cells arranged on the same word line may constitute three physical programming units, wherein the physical programming units constituted by LSB of the memory cells is called as a lower physical programming unit, the physical programming unit constituted by CSB of the memory cells is called a middle physical programming nit, and the physical programming unit constituted by MSB of the memory cells is called an upper physical programming unit. One physical erasing unit is constituted by a plurality of the physical programming unit sets including the lower physical programming unit, the middle programming unit and the upper physical programming unit constituted by the plurality of memory cells arranged on the same word line.

However, the present invention is not limited thereto. The rewritable non-volatile memory module 406 may be a Multi Level Cell (MLC) NAND flash memory module (i.e., a flash memory module that can store two data bits in one memory cell), other flash memory module or other memory modules having the same characteristics.

Figure 5:
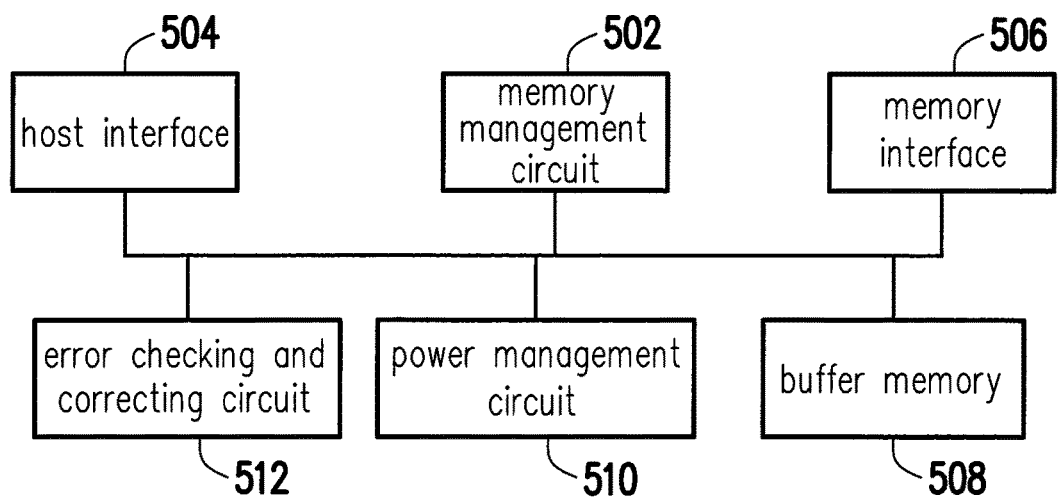
FIG. 5 is a schematic block view of a memory control circuit unit according to an exemplary embodiment.

FIG. 5 is a schematic block view of a memory control circuit unit according to an exemplary embodiment.

Referring to FIG. 5, the memory control circuit unit 404 includes a memory management circuit 502, a host interface 504 and a memory interface 506, a buffer memory 508, a power source management circuit 510 and an error checking and correcting circuit 512.

The memory management circuit 502 controls the overall operation of the memory control circuit unit 404. Specifically, the memory management circuit 502 has a plurality of control commands, and when the memory storage device 10 is operated, the control commands are executed to perform writing, reading and erasing operations on data.

In the exemplary embodiment, the control commands of the memory management circuit 502 are implemented in the form of firmware. For example, the memory management circuit 502 has a microprocessor unit (not shown) and a read only memory (not shown), and the control commands are recorded into the read only memory. When the memory storage device 10 is operated, the control commands are executed by the microprocessor unit to perform writing, reading and erasing operations on data.

In another exemplary embodiment, the control commands of the memory management circuit 502 may be stored in a specific area (e.g., a system area in the memory module that is exclusively used for storing system data) of the rewritable non-volatile memory module 406 in the form of program code. In addition, the memory management circuit 502 has a microprocessor unit (not shown), a read only memory (not shown) and a random access memory (not shown). In particular, the read only memory has a boot code, and when the memory control circuit unit 404 is enabled, the microprocessor unit executes the boot code first to load the control command stored in the rewritable non-volatile memory module 406 into the RAM of the memory management circuit 502. Thereafter, the microprocessor unit runs the control commands to perform writing, reading and erasing operations on data.

In addition, in another exemplary embodiment of the invention, the control commands of the memory management circuit 502 may be implemented in the form of hardware. For example, the memory management circuit 502 includes a micro-controller, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the micro-controller. Specifically, the memory cell management circuit manages the physical erasing unit of the rewritable non-volatile memory module 406; the memory writing circuit gives a write command to the rewritable non-volatile memory module 406 to write the data into the rewritable non-volatile memory module 406; the memory reading circuit gives a read command to the rewritable non-volatile memory module 406 to read data from the rewritable non-volatile memory module 406; the memory erasing circuit gives an erase command to the rewritable non-volatile memory module 406 to erase the data from the rewritable non-volatile memory module 406; and the data processing circuit processes the data to be written into the rewritable non-volatile memory module 406 and reads data from the rewritable non-volatile memory module 406.

The host interface 504 is coupled to the memory management circuit 502 and also coupled to the connecting interface unit 402 to receive and identify the command and data transmitted by the host system 11. In other words, the command and data transmitted by the host system 11 are transmitted to the memory management circuit 502 via the host interface 504. In the exemplary embodiment, the host interface 504 meets the SATA standard. However, it should be understood that the present invention provides no limitation thereto. The host interface 504 may also meet the PATA standard, the IEEE 1394 standard, the PCI Express standard, the USB standard, the UHS-I interface standard, the UHS-II interface standard, the SD standard, the MS standard, the MMC standard, the CF standard, the IDE standard or other suitable data transmitting standard.

The memory interface 506 is coupled to the memory management circuit 502 and accesses the rewritable non-volatile memory module 406. In other words, the data that is to be written into the rewritable non-volatile memory module 406 is converted by the memory interface 506 into a format that can be accepted by the rewritable non-volatile memory module 406.

The buffer memory 508 is coupled to the memory management circuit 502 and stores the data and command from the host system 11 temporarily or the data from the rewritable non-volatile memory module 406.

The power management circuit 510 is coupled to the memory management circuit 502 and controls the power of the memory storage device 10.

The error checking and correcting circuit 512 is coupled to the memory management circuit 502 and performs an error checking and correcting process to ensure accuracy of the data. Specifically, when the memory management circuit 502 receives a write command from the host system 11, the error checking and correcting circuit 512 generates a corresponding error checking and correcting code (ECC code) corresponding to the write command, and the memory management circuit 502 writes the data corresponding to the write command and the corresponding error checking and correcting code into the rewritable non-volatile memory module 406. Thereafter, when reading the data from the rewritable non-volatile memory module 406, the memory management circuit 502 also reads the error checking and correcting code corresponding to the data, and the error checking and correcting circuit 512 performs the error checking and correcting process on the read data according to the error checking and correcting code. In descriptions hereinafter, the operations performed by the MMC 502, the host interface 504, the memory interface 506, the buffer memory 508, the power management circuit 510, and the error checking and correcting circuit 512 may also be referred to as performed by the MCC unit 404. It is noted that in the following description, some terms may be replaced with corresponding abbreviations for ease of reading (see Table 1).

TABLE 1

| rewritable non-volatile memory module | RNVM module |
|---|---|
| physical erasing unit | PEU |
| physical programming unit | PPU |

TABLE 1-continued

| rewritable non-volatile memory module | RNVM module |
|---|---|
| logical erasing unit | LEU |
| logical programming unit | LPU |
| memory management circuit | MMC |
| memory control circuit | MCC |
| garbage collection operation | GCO |

Figure 6:
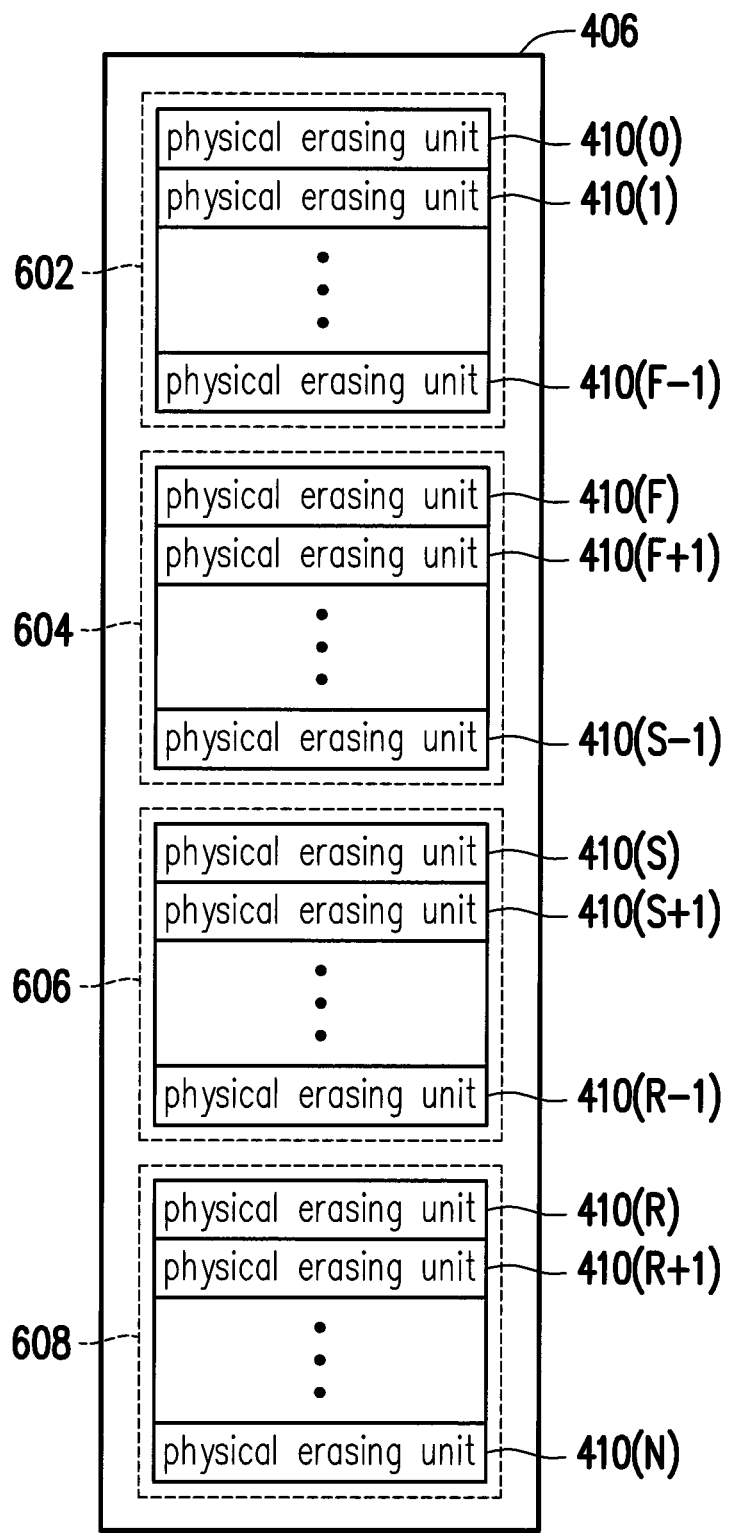
FIG. 6 and FIG. 7 are exemplary schematic views of a management physical erasing unit according to an exemplary embodiment.
Figure 7:
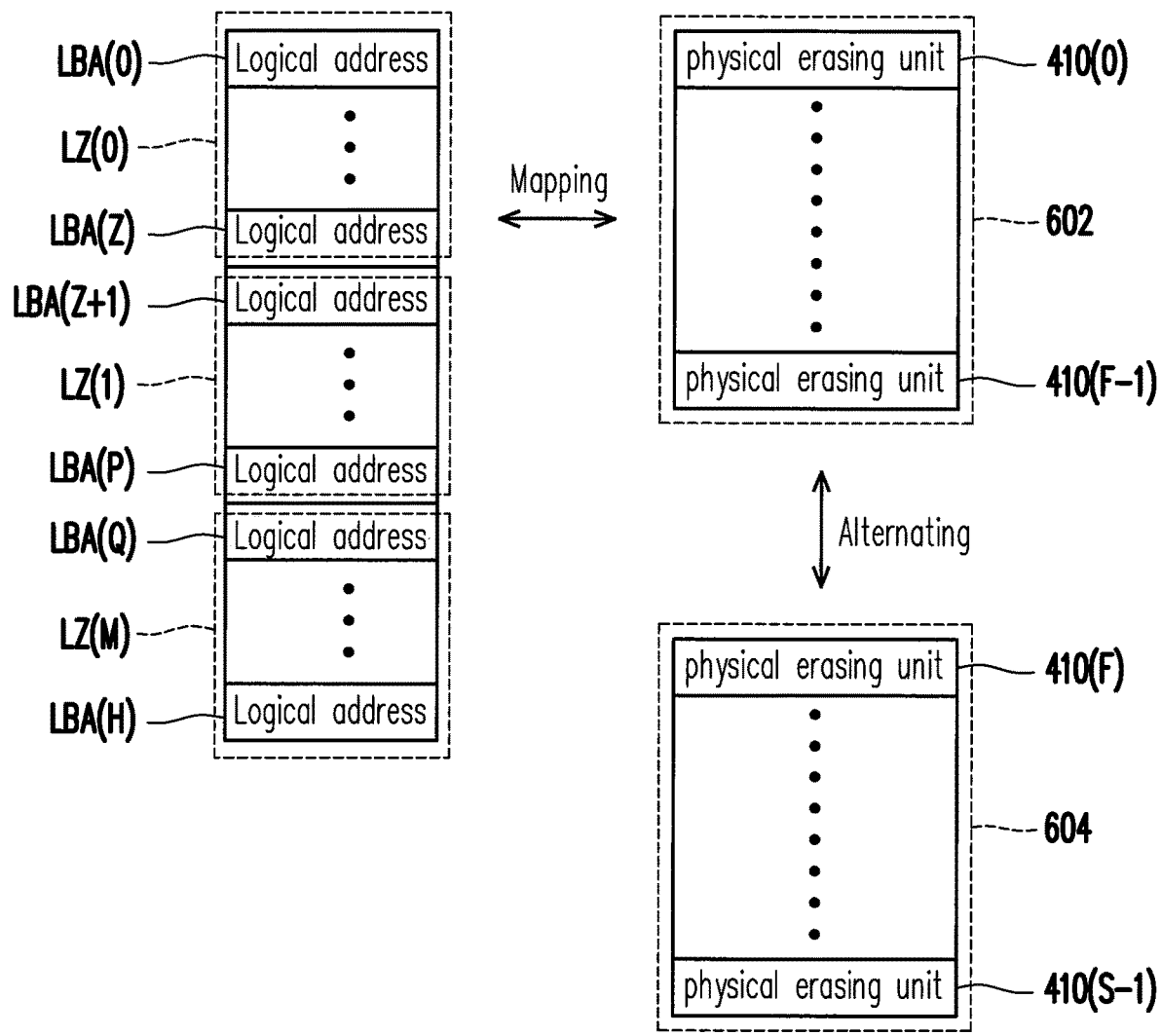

FIG. 6 and FIG. 7 are exemplary schematic views of a management PEU according to an exemplary embodiment.

It should be understood that in description of the operations of the PEUs of the rewritable non-volatile memory module 406, the terms "get", "retrieve", "group", "divide" and "associate" and so on used for the PEUs are logical concepts. Namely, the PEUs of the rewritable non-volatile memory module are operated logically, while actual locations of the PEUs of the rewritable non-volatile memory module are not changed.

The following paragraph describes the operations performed by the MMC 502, the host interface 504 and the memory interface 506, the buffer memory 508, the power management circuit 510 and the error checking and correcting circuit 512. It may also refer to the operation performed by the MCC unit 404.

Referring to FIG. 6, the MMC 502 logically groups the PEUs 410(0)~410(N) into a data area 602, a free area 604, a system area 606 and replacement area 608.

The PEU that logically belongs to the data area 602 and the free area 604 stores the data from the host system 11. Specifically, the PEU of the data area 602 is regarded as the PEU in which the data is stored, and the PEU of the free area 604 is used to replace the PEU of the data area 602. In other words, when the host system 11 receives the write command and the data to be written, the MMC 502 retrieves the PEU from the free area 604, and writes the data into the retrieved PEU to replace the PEU in the data area 602.

The PEU that logically belongs to the system area 606 records system data. For example, the system data includes the manufacturer and model number of the rewritable non-volatile memory module, the number of the PEU in the rewritable non-volatile memory module, the number of PPU of each of the PEUs and so on.

The PEU that logically belongs to the replacement area 608 is used in a bad PEU replacing process to replace the damaged PEU. Specifically, if there is still normal PEU in the replacement area 608 and the PEU in the data area 602 is damaged, the MMC 502 retrieves the normal PEU from the replacement area 608 to replace the damaged PEU.

In particular, the number of the PEU in the data area 602, the free area 604, the system area 606 and the replacement area 608 varies according to the specification of different memories. In addition, it should be indicated that, in the operation of the memory storage device 10, the grouping relationship in which the PEU is associated to the data area 602, the free area 604, the system area 606 and the replacement area 608 is changed dynamically. For example, when the PEU in the free area 604 is damaged and replaced by the PEU in the replacement area 608, the PEU which is originally in the replacement area 608 is associated to the free area 604.

Referring to FIG. 7, the MMC 502 is provided with logical units LBA(0)~LBA(H) to map the PEU in the data area 602, wherein each of the logical units has a plurality of logical sub-units to map the PPU corresponding to the PEU. Meanwhile, when the host system 11 is to write data to the logical unit or updates the data stored in the logical unit, the MMC 502 retrieves a PEU from the free area 604 to write data, so as to alternate the PEU in the data area 602. In the exemplary embodiment, the logical sub-unit may be a logical page or a logical sector.

In order to identify which PEU in which the data of each of the logical units is stored, in the exemplary embodiment, the MMC 502 records mapping between the logical unit and the PEU. Meanwhile, when the host system 11 is to access data in the logical sub-unit, the MMC 502 verifies the logical unit to which the logical sub-unit belongs, and accesses data in the PEU mapped by the logical unit. For example, in the exemplary embodiment, the MMC 502 stores a logical-physical mapping table in the rewritable non-volatile memory module 406 to record the PEU mapped by each of the logical units, and when the data is to be accessed, the MMC 502 loads the logical-physical mapping table into the buffer memory 508 for maintenance.

It should be mentioned that, since the capacity of the buffer memory 508 is limited and cannot store the mapping table that records the mapping relationship of all the logical units, in the exemplary embodiment, the MMC 502 groups the logical units LBA(0)~LBA(H) into a plurality of logical areas LZ(0)~LZ(M), and each of the logical areas is provided with a logical-physical mapping table. Specifically, when the MMC 502 is to update the mapping of a particular logical unit, the logical-physical mapping table that corresponds to the logical area to which the logical unit belongs is loaded into the buffer memory 508 to be updated.

In the exemplary embodiment, the MMC 502 uses a first mode or a second mode to program the PEU. For example, if the data to be written is the logical-physical mapping table, the MMC 502 uses the single layer erasing operation corresponding to the first programming mode to erase the PEU, and uses the first programming mode to write the logical-physical mapping table into the PEU. For example, if the data to be written is the user's data from the host system 11, the MMC 502 uses the multi-layer erasing operation corresponding to the second programming mode to erase the PEU, and uses the second programming mode to write the user's data into the PEU.

Here, the first programming mode refers to a programming mode in which one memory cell stores data of one bit. For example, in the first programming mode, the MMC 502 uses the single layer memory cell (SLC) mode, a lower physical programming mode, a mixture programming mode or a less layer memory cell mode to program the memory cell of the PEU. In other words, in the first programming mode, the MMC 502 only performs data writing operation on the lower PPU. Therefore, in the exemplary embodiment, only one-third of the capacity of a PEU that is programmed via the first programming mode is used.

The second programming mode refers to a programming mode in which one memory cell stores data of a plurality of bits. For example, in the second programming mode, the MMC 502 uses the MLC programming mode, the TLC memory cell programming mode or a similar mode to program the memory cell of the PEU. In other words, when the second programming mode is used to write data, the MMC 502 performs programming operation on one PPU set. It should be indicated that, as compared with the PEU that is operated via the first programming mode, the lifespan of the PEU that is operated via the second programming mode is shorter. Specifically, the number of times that each of the PEUs can be written or erased is limited. When the writing counts of each one of the PEUs exceeds a threshold value, the PEU is likely to be damaged and cannot be written with any data, wherein the wear of the PEU that is operated via the second programming mode is higher, and the wear of the PEU that is operated via the first programming mode is lower.

In the exemplary embodiment, when there is no valid data (e.g., all of the stored data is marked as invalid data) in one PEU, the MMC 502 may perform an erasing operation on the PEU for data to be written in again. In the exemplary embodiment, the MMC 502 records a corresponding erasing count for each of the PEUs 410(0)~410(N). For example, when one of the PEUs in the rewritable non-volatile memory module 406 is erased, the MMC 502 adds 1 to the erasing count corresponding to the PEU. Here, the erasing counts may be recorded in one erasing count table or a corresponding PEU.

Apart from the erasing count table, the MMC 502 records a corresponding wear value for each of the PEUs 410(0) ~410(N). For example, in the exemplary embodiment, the wear value corresponding to each of the PEUs 410(0)~410(N) is initially set as 0. When the erasing operation is performed on one of the PEUs, the MMC 502 updates the wear value of the PEU according to the type of the erasing operation that is performed. Specifically, when performing the single layer erasing operation on one of the PEUs (which may also serve as reference for the first PEU hereafter), the MMC 502 adds a first parameter to the wear value of the first PEU as a new wear value. When the multi-layer erasing operation is performed on the first PEU, the MMC 502 adds a second parameter to the wear value of the first PEU as a new wear value. Here, the second parameter is larger than the first parameter. For example, in the exemplary embodiment, the first parameter is 1, and the second parameter is 10. In the exemplary embodiment, the MMC 502 performs the wear leveling operation according to the wear value of each of the PEUs 410(0)~410(N). In other words, when the wear leveling operation is to be performed, based on the wear value, the one of the PEUs that is performed the multi-layer erasing operation for n times is performed the wear leveling operation first than the one of the PEUs that is performed the single layer erasing operation for n times.

FIG. 8 is a schematic view of an erasing count table according to an exemplary embodiment.

Referring to FIG. 8, an erasing count table 800 includes a PEU field, a single layer erasing count field, a multi-layer erasing count field and an erasing count field. When the memory storage device 10 is operated, the MMC 502 updates the erasing count table 800 according to each erasing operation to record the single layer erasing count, the multi-layer erasing count and erasing count of each of the PEUs.

FIG. 9 is a schematic view of a wear table according to an exemplary embodiment.

Referring to FIG. 9, a wear table 900 includes a PEU field, a single layer erasing count field, a multi-layer erasing count field and a wear value field. When the memory storage device 10 is operated, the MMC 502 updates the wear table 900 according to each erasing operation, the first parameter and the second parameter to record the single layer erasing count, the multi-layer erasing count and the wear value of each of the PEUs. For example, the MMC 502 multiplies the single layer erasing count of the PEU by the first parameter to obtain a value (which is also referred to as a first sub-wear value), multiplies the multi-layer erasing count of the PEU by the second parameter to obtain a value (which is also referred to as a second sub-wear value), and adds up the first sub-wear value and the second sub-wear value of the PEU to obtain the wear value corresponding to the PEU.

Referring to FIG. 8 and FIG. 9, in the erasing count table 800, the PEU 410(0) has the highest erasing counts, but the PEU 410(100) has the highest wear value in the wear table 900. Based on the above, performing the wear leveling operation according to the wear value of the PEUs 410(0) ~410(N) allows the PEUs 410(0)~410(N) in the rewritable non-volatile memory module 406 to be used uniformly.

It should be indicated that although the erasing count table 800 is recorded with the single layer erasing count and multi-layer erasing count, the invention is not limited thereto. In another exemplary embodiment, the MMC 502 may directly calculate and update the erasing count of the PEUs 410(0)~410(N) according to the erasing operation without having to record the single layer erasing count and multi-layer erasing count. Similarly, although the wear table 900 is recorded with the single layer erasing count and the multi-layer erasing count, the invention is not limited thereto. In another exemplary embodiment, the MMC 502 may directly calculate and update the wear value of the PEUs 410(0)~410(N) according to the type of erasing operation, the first parameter and the second parameter without having to record the single layer erasing count and multi-layer erasing count.

Figure 10:
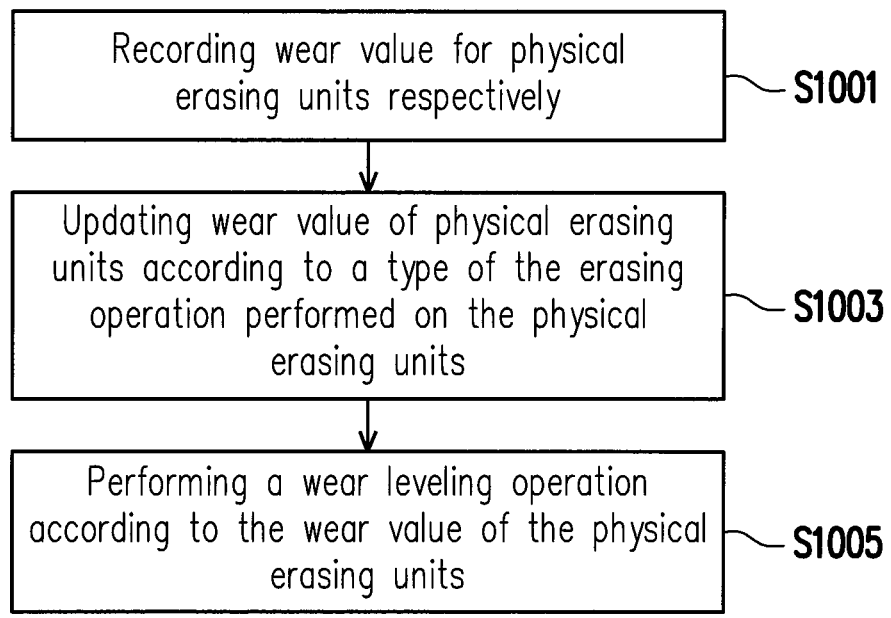
FIG. 10 is a flowchart of a memory management method according to an exemplary embodiment.

FIG. 10 is a flowchart of a memory management method according to an exemplary embodiment.

Referring to FIG. 10, in step S1001, the MMC 502 records a wear value for the PEUs 410(0)~410(N) respectively. Meanwhile, in step S1003, the MMC 502 updates the wear value of the PEUs 410(0)~410(N) according to the type of erasing operation performed on the PEUs 410(0)~410(N). The calculating and recording methods of the wear value of the PEUs 410(0)~410(N) are described above; thus, no repetition is incorporated herein.

In step S1005, the MMC 502 performs the wear leveling operation according to the wear value of the PEUs 410(0) ~410(N).

Figure 11:
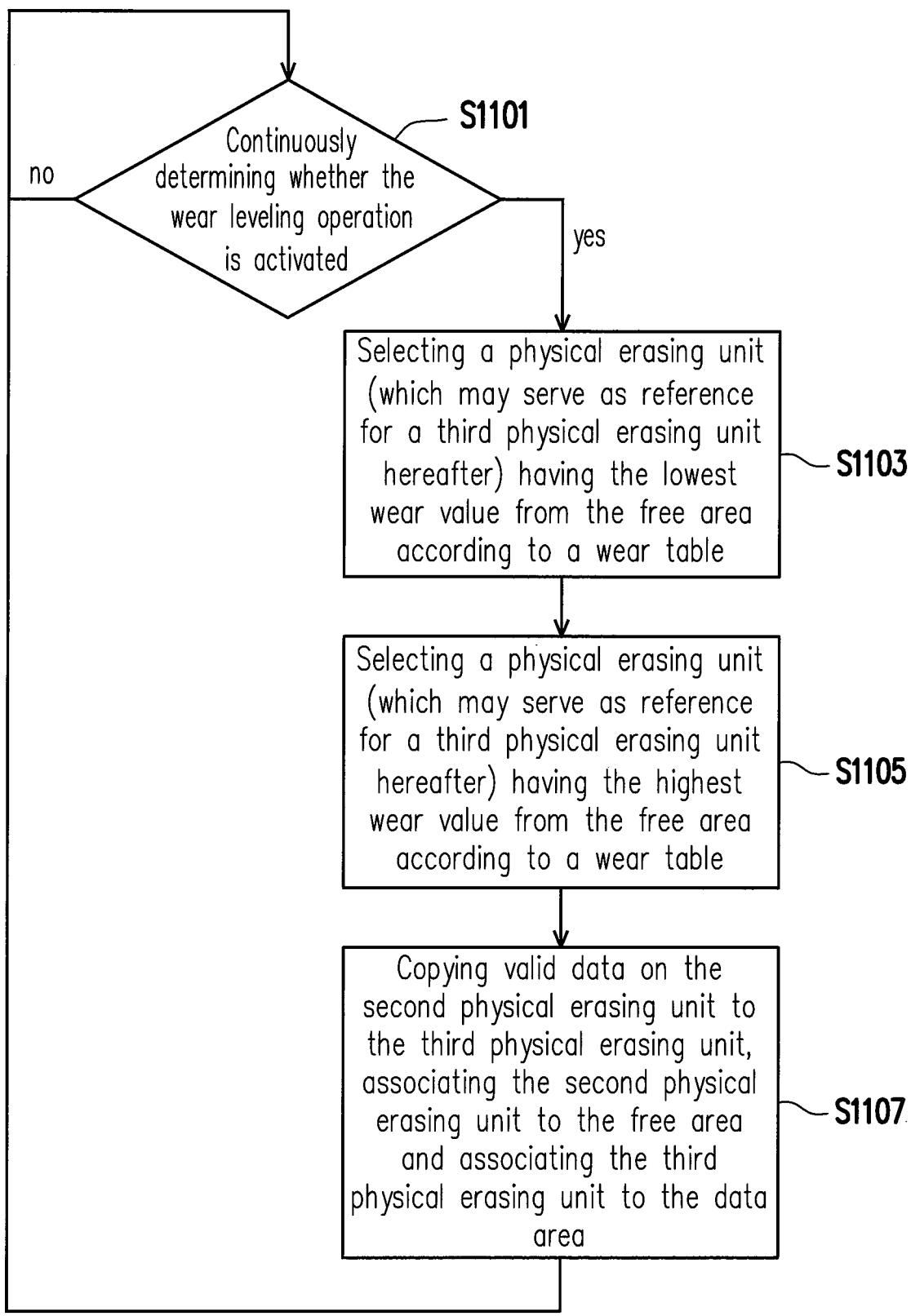
FIG. 11 is a flowchart of performing a wear leveling operation according to an exemplary embodiment.

FIG. 11 is a flowchart of performing a wear leveling operation according to an exemplary embodiment.

Referring to FIG. 11, in step S1101, the MMC 502 continuously determines whether the wear leveling operation is activated. For example, when the memory storage device 11 is operated beyond a predetermined time period or a total erasing count of the PEU in the rewritable non-volatile memory module 406 is larger than a predetermined threshold, the MMC 502 activates the wear leveling operation.

If the wear leveling operation is activated, in step S1103, the MMC 502 selects a PEU (which may serve as reference for a second PEU hereafter) having the lowest wear value from the data area 602 according to the wear table 900. For example, referring to FIG. 9, assuming that the PEUs 410(0)~410(96) are associated with the data area 602, and the wear value of the PEU 410(4) is the lowest, based on the above, the MMC 502 selects the PEU 410(4) from the data area 602.

In step S1105, the MMC 502 selects a PEU (which may serve as reference for a third PEU hereafter) having the highest wear value from the free area 604 according to the wear table 900. For example, referring to FIG. 9, assuming that the PEUs 410(97)~410(100) are associated with the free area 604, the PEU 410(100) has the highest wear value, based on the above, the MMC 502 selects the PEU 410(100) from the free area 605.

In step S1107, the MMC 502 copies the valid data on the second PEU to the third PEU, associates the second PEU to the free area 604, and associates the third PEU to the data area. For example, in the logical-physical mapping table, the logical unit that is originally mapped to the PEU 410(4) is updated to be mapped to the PEU 410(100) so as to associate the PEU 410(100) to the data area 602, and the PEU 410(4) is added to a free area queue table so as to associate the PEU 410(4) to the free area 604.

It should be mentioned that, in the exemplary embodiment, the ratio of the first parameter to the second parameter is fixed. For example, as mentioned above, the ratio of the first parameter to the second parameter is 1:10, which should not be construed as a limitation to the present invention. In another exemplary embodiment, the MMC 502 may dynamically adjust the ratio of the first parameter to the second parameter according to the total erasing counts of the PEUs in the rewritable non-volatile memory module 406. For example, when the average erasing count of the PEUs in the rewritable non-volatile memory module 406 is larger than an average erasing threshold value (e.g., 500), the ratio of the first parameter to the second parameter is adjusted to be 1:100. In other words, the second parameter is adjusted to be 100. Based on the above, the wear of the PEUs 410(0)~410(N) can be measured in a more accurate way.

In summary, according to the exemplary embodiments, the memory management method, the MCC unit and the memory storage device estimates the wear value of the PEU according to the wear caused to the memory cell under different programming modes, and the wear leveling operation is performed according to the estimated wear value. In this manner, each of the PEUs can be used more uniformly so that the lifespan of the memory storage device can be improved effectively.

Although the invention has been disclosed by the above embodiments, the embodiments are not intended to limit the invention. It will be apparent to those skilled in the art that various modifications and variations can be made to the structure of the invention without departing from the scope or spirit of the invention. Therefore, the protecting range of the invention falls in the appended claims.

What is claimed is:

1. A memory management method for a rewritable non-volatile memory module, wherein the rewritable non-volatile memory module has a plurality of physical erasing units, the memory management method comprising:
   performing a single layer erasing operation on one of the plurality of physical erasing units for n times;
   performing a multi-layer erasing operation on another one of the plurality of physical erasing units for n times;
   recording a wear value for each of the plurality of physical erasing units;
   updating the wear value of the plurality of physical erasing units according to a type of the erasing operation performed on the plurality of physical erasing units, wherein if the single layer erasing operation is performed on a first physical erasing unit of the plurality of physical erasing units, a wear value corresponding to the first physical erasing unit is updated according to a first parameter corresponding to the single layer erasing operation, and if the multi-layer erasing operation is performed on the first physical erasing unit, a wear value corresponding to the first physical erasing unit is updated according to a second parameter corresponding to the multi-layer erasing operation, and the second parameter is no less than the first parameter; and
   performing a wear leveling operation on the one and the another one of the physical erasing units according to the wear value of the plurality of physical erasing units, wherein the another one of the physical erasing units is performed the wear leveling operation first than the one of the physical erasing units.

2. The memory management method according to claim 1, further comprising:
establishing a wear table, and recording the wear value of the plurality of physical erasing units in the wear table.

3. The memory management method according to claim 1, further comprising:
recording a single layer erasing count for each of the plurality of physical erasing units; and
recording a multi-layer erasing count for each of the plurality of physical erasing units.

4. The memory management method according to claim 3, wherein the step of updating the wear value of the plurality of physical erasing units according to the type of the erasing operation performed on the plurality of physical erasing units comprises:
obtaining a wear value of the plurality of physical erasing units according to the single layer erasing count and the multi-layer erasing count of the plurality of physical erasing units,
wherein the wear value of the first physical erasing unit is obtained by adding up a first sub-wear value and a second sub-wear value, the first sub-wear value is obtained by multiplying the single layer erasing count of the first physical erasing unit by the first parameter, and the second wear value is obtained by multiplying the multi-layer erasing count of the first physical erasing units by the second parameter.

5. The memory management method according to claim 1, further comprising:
adjusting a ratio of the second parameter to the first parameter dynamically according to an erasing count of the plurality of physical erasing units.

6. The memory management method according to claim 1, further comprising:
at least grouping the plurality of physical erasing units into a data area and a free area,
wherein the step of performing the wear leveling operation according to the wear value of the plurality of physical erasing units comprises:
selecting a second physical erasing unit from the physical erasing units from the data area, wherein a wear value of the second physical erasing unit is smaller than a wear value of other physical erasing unit among the physical erasing units in the data area;
selecting a third physical erasing unit from the physical erasing units from the free area, wherein a wear value of the third physical erasing unit is larger than the wear value of the other physical erasing unit among the physical erasing units in the free area;
copying a data in the second physical erasing unit to the third physical erasing unit, associating the third physical erasing unit to the data area, and associating the second physical erasing unit to the free area.

7. A memory management method for a rewritable non-volatile memory module, wherein the rewritable non-volatile memory module has a plurality of physical erasing units, the memory management method comprising:
recording a wear value for each of the plurality of physical erasing units;
using a first programming mode to program a first physical erasing unit among the plurality of physical erasing units to store a single bit in each memory cell of the first physical erasing unit and updating a wear value corresponding to the first physical erasing unit according to a first parameter and a single layer erasing count corresponding to the first physical erasing unit; and
using a second programming mode to program the first physical erasing unit to store a plurality of bits in each memory cell of the first physical erasing unit and updating the wear value corresponding to the first physical erasing unit according to a second parameter and a multi-layer erasing count corresponding to the first physical erasing unit.

8. The memory management method according to claim 7, further comprises:
updating the single layer erasing count corresponding to the first physical erasing unit after an erasing operation is performed on the first physical erasing unit and the first physical erasing unit stores the single bit;
updating the multi-layer erasing count corresponding to the first physical erasing unit after the erasing operation is performed on the first physical erasing unit and the first physical erasing unit stores the plurality of bits; and
obtaining the wear value corresponding to the first physical erasing unit according to the single layer erasing count and the multi-layer erasing count,
wherein the wear value corresponding to the first physical erasing unit is obtained by adding up a first sub-wear value and a second sub-wear value, the first sub-wear value is obtained by multiplying the single layer erasing count by the first parameter, and the second sub-wear value is obtained by multiplying the multi-layer erasing count by the second parameter.

9. A memory control circuit unit for controlling a rewritable non-volatile memory module, wherein the rewritable non-volatile memory module has a plurality of physical erasing units, the memory control circuit unit comprising:
a host interface, coupled to a host system;
a memory interface, coupled to the rewritable non-volatile memory module; and
a memory management circuit, coupled to the host interface and the memory interface,
wherein the memory management circuit performs a single layer erasing operation on one of the plurality of physical erasing units for n times,
wherein the memory management circuit further performs a multi-layer erasing operation on another one of the plurality of physical erasing units for n times,
wherein the memory management circuit further records a wear value for each of the plurality of physical erasing units,
wherein the memory management circuit further updates the wear value of the plurality of physical erasing units according to a type of the erasing operation performed on the plurality of physical erasing units,
wherein if the single layer erasing operation is performed on a first physical erasing unit among the plurality of physical erasing units, a wear value corresponding to the first physical erasing unit is updated according to a first parameter corresponding to the single layer erasing operation, and if the multi-layer erasing operation is performed on the first physical erasing unit, a wear value corresponding to the first physical erasing unit is updated according to a second parameter corresponding to the multi-layer erasing operation, and the second parameter is no less than the first parameter,
wherein the memory management circuit further performs a wear leveling operation on the one and the another one of the physical erasing units according to the wear value of the plurality of physical erasing units, wherein the another one of the physical erasing units is performed the wear leveling operation first than the one of the physical erasing units.

10. The memory control circuit unit according to claim 9, wherein the memory management circuit further establishes a wear table, and recording the wear value of the plurality of physical erasing units in the wear table.

11. The memory control circuit unit according to claim 9, wherein the memory management circuit further records a single layer erasing count for each of the plurality of physical erasing units, and records a multi-layer erasing count for each of the plurality of physical erasing units.

12. The memory control circuit unit according to claim 11, wherein in the operation of updating the wear value of the plurality of physical erasing units according to the type of the erasing operation performed on the plurality of physical erasing units, the memory management circuit generates the wear value of the plurality of physical erasing units according to the single layer erasing count and the multi-layer erasing count of the plurality of physical erasing units,
wherein the wear value of the first physical erasing unit is obtained by adding up a first sub-wear value and a second sub-wear value, the first sub-wear value is obtained by multiplying the single layer erasing count of the first physical erasing unit by the first parameter, and the second sub-wear value is obtained by multiplying the multi-layer erasing count of the first physical erasing unit by the second parameter.

13. The memory control circuit unit according to claim 9, wherein the memory management circuit further adjusts a ratio of the second parameter to the first parameter dynamically according to an erasing count of the plurality of physical erasing units.

14. The memory control circuit unit according to claim 9, wherein the memory management circuit further at least groups the plurality of physical erasing units into a data area and a free area,
wherein in the operation of performing the wear leveling operation according to the wear value of the plurality of physical erasing units, the memory management circuit selects a second physical erasing unit from the physical erasing units from the data area, selects a third physical erasing unit from the physical erasing units from the free area, copies a data in the second physical erasing unit to the third physical erasing unit, associates the third physical erasing unit to the data area, and associates the second physical erasing unit to the free area,
wherein a wear value of the second physical erasing unit is smaller than a wear value of other physical erasing unit in the physical erasing units in the data area,
wherein a wear value of the third physical erasing unit is larger than the wear value of the other physical erasing unit in the physical erasing units in the free area.

15. A memory storage device, comprising:
a connecting interface unit, coupled to a host system;
a rewritable non-volatile memory module, comprising a plurality of physical erasing units; and
a memory control circuit unit, coupled to the connecting interface unit and the rewritable non-volatile memory module,
wherein the memory control circuit unit performs a single layer erasing operation on one of the plurality of physical erasing units for n times,
wherein the memory control circuit unit further performs a multi-layer erasing operation on another one of the plurality of physical erasing units for n times,
wherein the memory control circuit unit records a wear value for each of the plurality of physical erasing units,
wherein the memory control circuit unit further updates the wear value of the plurality of physical erasing units according to a type of the erasing operation performed on the plurality of physical erasing units,
wherein if the single layer erasing operation is performed on a first physical erasing unit among the plurality of the physical erasing units, a wear value corresponding to the first physical erasing unit is updated according to a first parameter corresponding to the single layer erasing operation, and if the multi-layer erasing operation is performed on the first physical erasing unit, the wear value corresponding to the first physical erasing unit is updated according to a second parameter corresponding to the multi-layer erasing operation, and the second parameter is no less than the first parameter,
wherein the memory control circuit unit further performs a wear leveling operation on the one and the another one of the physical erasing units according to the wear value of the plurality of the physical erasing units,
wherein the another one of the physical erasing units is performed the wear leveling operation first than the one of the physical erasing units.

16. The memory storage device according to claim 15, wherein the memory control circuit unit further establishes a wear table and records the wear value of the plurality of physical erasing units in the wear table.

17. The memory storage device according to claim 15, wherein the memory control circuit unit further records a single layer erasing count for each of the plurality of physical erasing units, and records a multi-layer erasing count for each of the plurality of physical erasing units.

18. The memory storage device according to claim 15, wherein in the operation of updating the wear value of the plurality of physical erasing units according to the type of erasing operation performed on the plurality of physical erasing units, the memory control circuit unit generates the wear value of the plurality of physical erasing units according to the single layer erasing count and the multi-layer erasing count of the plurality of physical erasing units,
wherein the wear value of the first physical erasing unit is obtained by adding up a first sub-wear value and a second sub-wear value, the first sub-wear value is obtained by multiplying the single layer erasing count of the first physical erasing unit by the first parameter, and the second sub-wear value is obtained by multiplying the multi-layer erasing count of the first physical erasing unit by the second parameter.

19. The memory storage device according to claim 17, wherein the memory control circuit unit further adjusts a ratio of the second parameter to the first parameter dynamically according to an erasing count of the plurality of physical erasing units.

20. The memory storage device according to claim 17, wherein the memory control circuit unit further at least groups the plurality of physical erasing units into a data area and a free area,
wherein in the operation of performing the wear leveling operation according to the wear value of the plurality of physical erasing units, the memory control circuit unit selects a second physical erasing unit from the physical erasing units from the data area, selects a third physical erasing unit from the physical erasing units from the free area, copies a data in the second physical erasing unit to the third physical erasing unit, associates the third physical erasing unit to the data area, and associates the second physical erasing unit to the free area,
wherein a wear value of the second physical erasing unit is smaller than a wear value of other physical erasing unit in the physical erasing units in the data area,
wherein a wear value of the third physical erasing unit is larger than the wear value of the other physical erasing unit in the physical erasing units in the free area.

\* \* \* \* \*